United States Patent
Shukh

(10) Patent No.: US 6,845,038 B1
(45) Date of Patent: Jan. 18, 2005

(54) MAGNETIC TUNNEL JUNCTION MEMORY DEVICE

(76) Inventor: Alla Mikhailovna Shukh, 13461 Foxberry Rd., Savage, MN (US) 55378

(*) Notice: Subject to any disclaimer, the term of this patent is extended or adjusted under 35 U.S.C. 154(b) by 0 days.

(21) Appl. No.: 10/836,565

(22) Filed: May 1, 2004

Related U.S. Application Data

(63) Continuation of application No. 10/765,638, filed on Jan. 27, 2004, now abandoned.
(60) Provisional application No. 60/444,240, filed on Feb. 1, 2003.

(51) Int. Cl.$^7$ ............................ G11C 11/14; G11C 11/50
(52) U.S. Cl. ......................................... 365/171; 365/164
(58) Field of Search ................................ 365/171, 164, 365/173, 97, 55, 66

(56) References Cited

U.S. PATENT DOCUMENTS

| | | | |
|---|---|---|---|
| 4,360,899 A | 11/1982 | Dimyan et al. | |
| 5,477,482 A | 12/1995 | Prinz | |
| 5,640,343 A | 6/1997 | Gallagher et al. | |
| 5,741,435 A | 4/1998 | Beetz, Jr. et al. | |
| 5,841,692 A | 11/1998 | Gallagher et al. | |
| 6,114,719 A | 9/2000 | Dill et al. | |
| 6,219,275 B1 | 4/2001 | Nishimura | |
| 6,269,018 B1 | 7/2001 | Monsma et al. | |
| 6,351,410 B1 * | 2/2002 | Nakao et al. | ................ 365/171 |
| 6,413,788 B1 | 7/2002 | Tuttle | |
| 6,498,747 B1 | 12/2002 | Gogl et al. | |
| 6,518,588 B1 | 2/2003 | Parkin et al. | |
| 6,532,164 B2 | 3/2003 | Redon et al. | |
| 6,538,297 B2 * | 3/2003 | Odagawa et al. | ........... 365/171 |
| 6,542,398 B2 | 4/2003 | Kang et al. | |
| 6,611,455 B2 | 8/2003 | Sekiguchi et al. | |
| 2002/0167059 A1 | 11/2002 | Nishimura et al. | |

OTHER PUBLICATIONS

J.M. Daughton, Advanced MRAM Concepts, NVE Corp., Feb. 7, 2001, pp. 1–6.

* cited by examiner

*Primary Examiner*—Thong Q. Le

(57) ABSTRACT

A memory cell for magnetic random access memory devices based on a magnetic tunnel junction (MTJ) memory element with a perpendicular orientation of magnetization in pinned and free magnetic layers, and a tunnel barrier layer sandwiched between the pinned and free layers. The memory cell can include the MTJ memory element, a magnetic flux guide in series with selection devices, such as a bit line, a word line, and a transistor. The magnetic flux guide can have two electrically conductive magnetic portions with the MTJ memory element positioned between the magnetic portions. The MTJ memory element is magnetically isolated from the magnetic flux guide by thin non-magnetic conductive spacers. The MTJ memory element is arranged in a vertical space between the intersecting bit and word lines at their intersection region. The memory cell also includes write and excitation lines. The write line is parallel to the bit line and the excitation line is parallel to the word line. The write and excitation lines also intersect each other and define a corner. The MTJ memory element is positioned in the corner of the intercepting write and excitation lines.

23 Claims, 15 Drawing Sheets

MAGNETIC TUNNEL JUNCTION MEMORY DEVICE

CROSS-REFERENCE TO RELATED APPLICATION

This is a continuation of application Ser. No. 10/765,638 entitled "MAGNETIC TUNNEL JUNCTION MEMORY DEVICE", which was filed Jan. 27, 2004 now abandoned that claims the benefit of the filing date of U.S. provisional application Ser. No. 60/444,240 entitled "MAGNETIC TUNNEL JUNCTION MEMORY CELL WITH PERPENDICULAR MAGNETIC ANISOTROPY IN FREE AND PINNED LAYERS", which was filed Feb. 1, 2003, the entire content of which is incorporated herein by reference. FEDERALLY SPONSORED RESEARCH: Not Applicable SEQUENCE LISTING: Not Applicable

FIELD OF THE INVENTION

The present invention relates generally to the field of non-volatile memory devices for use in computers and other devices. More particularly, the present invention relates to a magnetic tunnel junction memory cell with a perpendicular orientation of magnetization in free and pinned layers of a magnetic tunneling junction memory element that is used as an individual memory cell of non-volatile magnetic random access memory arrays.

BACKGROUND OF THE INVENTION

The use of a magnetic tunnel junction element in a memory cell of a non-volatile magnetic random access memory (MRAM) arrays is described in U.S. Pat. No. 5,640,343. A typical MRAM device includes an array of memory cells positioned at the intersections of word lines and bit lines.

A typical memory cell may be composed of a magnetic tunnel junction (MTJ) memory element and a transistor or other non-linear element in series, and intersecting conductive lines. The memory cell is controlled by passing currents through two conductive lines. The MTJ element and the transistor are vertically arranged in the intersection region of the two conductive lines in a vertical space between the two lines to minimize a total MRAM surface area A typical MTJ memory element has a pinned (or fixed) magnetic layer, a free (or sense) magnetic layer, and an insulating tunnel barrier layer sandwiched between the ferromagnetic layers. The MTJ element exhibits a giant tunneling magnetoresistance in the presence of a magnetic field. Relative orientations of magnetization in the free and pinned ferromagnetic layers determine the resistance of the MTJ memory element. Generally, the resistance of the MTJ element is "low" if the magnetic layers have a parallel magnetization orientation, and the resistance is increased considerably if the magnetization orientation is changed from parallel to anti-parallel.

These two combinations of magnetization orientations, parallel and anti-parallel, present logic values of "0" and "1". The orientation may be changed from parallel to anti-parallel or vice-versa by applying the proper magnetic field to the MTJ memory element. A logic value may be written to an MTJ cell by setting the magnetization orientation in the free layer. The logic value stored in the MTJ cell may be read by sensing the resistance of the MTJ element.

FIGS. 1A and 1B show a schematic view of the structure and function of a MTJ memory cell 20 according to prior art. The memory cell 20 includes a MTJ memory element 12 and transistor 14 connected in series by means of conductive lead 16, conductive stud 14 and contact pad 12, a bit tine 16 and word line 18. The MTJ element 12 is vertically arranged at the intersection region of the bit 16 and word 18 tines. The MTJ memory element 12 is composed of a stack of an insulating tunnel barrier layer 15 sandwiched between two magnetic layers 11 and 13. Orientation of magnetization in both magnetic layers is parallel to a major plane (in-plane orientation) of the layers. One of the magnetic layers has a higher coercivity than that of the other magnetic layer. The magnetic layer 11 with the higher coercivity is normally called "a pinned layer". The other magnetic layer 13 with the low coercivity is normally called "a free layer". An antiferromagnetic pinning layer 17 anchors the magnetization orientation in the pinned layer 11 by means of an exchange coupling between the layers.

The orientation of magnetization in the free layer 13 may be changed by a relatively small external magnetic field (a bi-directional arrow). To change the orientation of magnetization in the pinned layer 11 much stronger external magnetic field needs to be applied (an unidirectional arrow). When the magnetization orientations of the free 13 and pinned 11 layers are anti-parallel, the resistance of the MTJ element 12 is high; when the magnetization orientations are parallel the resistance is low. The relative variation of the resistance between these two states may be up to 40% by appropriate choice of MTJ element materials, barrier layer thickness and other parameters.

The MTJ memory element 12 is positioned between the transistor 14 and the current supply bit line 16. In a "write" mode, a current $I_{W1}$, passing through the line 16 generates a magnetic field 19. The word line 18, orthogonal to the bit line 16 (i.e. in this case the word line 18 is perpendicular to a plane of the FIG. 1A). A current $I_{W2}$ flowing through the word line 18 generates a second magnetic field 21 (located in the plane of the figure).

In the "write" mode (FIG. 1A), the transistor 14 is blocked. The currents $I_{W1}$ and $I_{W2}$ flow through the bit line 16 and the word line 18, respectively. The MTJ element 12 is therefore subjected to two orthogonal magnetic fields 19 and 21, respectively. The field 19 is applied along a hard axis of magnetization in the free layer 13, in order to reduce its switching field. The magnetic field 21 being applied along an easy axis of magnetization in order to generate a reversal of the magnetization of the free layer 13 and thus writes in the memory element 12. In principle, only the memory element 12 located in the intersection region of the lines 16 and 18 is subject to reversal, since each magnetic field 19 or 21 taken individually is insufficient to cause reversal of the magnetization in the free magnetic layer 13.

In a "read" mode (FIG. 1B) the transistor 14 is opened and is held in a saturated condition (i.e. a sense current $I_S$ flowing through it is at a maximum) by a positive bias on its gate. The current $I_S$ flowing through the bit line 16 only passes through the MTJ memory element 12 whose transistor 14 is opened. This current enables the resistance of the MTJ element 12 to be measured. By comparison with a resistance of a reference memory cell (not shown), a magnetic state of the selected memory cell 20 ("0" or "1") may thus be determined.

The MTJ memory cells based on in-plane orientation of magnetization in free and pinned magnetic layers suffer from several disadvantages:

(a) MTJ element with in-plane orientation of magnetization in free and pinned magnetic layers require an elongated (rectangular, ellipse and the like) shape of the MTJ element with an aspect ratio (length/width) of 2 or higher in order to insure information storing and to reduce an error probability in the "write" mode. This limits the density of MTJ cells in a MRAM array.

(b) The specified elongated shape of the MTJ elements is difficult to reproduce in sub-micron range of dimensions across a MRAM array composed of thousand elements. The reduction of the MTJ element dimensions results in broadening of a statistical distribution of the element size and shape across the array. Therefore, accidental reverse of the adjacent elements simply by the effect of the magnetic field produced along one of the addressing lines, bit or word, increases.

(c) Number of addressing error in a MRAM array with in-plane orientation of magnetization increases with cell density increase.

(d) The MTJ elements with sub-micron dimensions suffer from instability at elevated temperature of operation.

All above-mentioned disadvantages limit an application of the MTJ memory cells with in-plane orientation of magnetization in the magnetic layers for high-density MRAM arrays.

A present invention addresses these needs. The invention provides a memory cell for a MRAM array with a perpendicular orientation of magnetization in the pinned and free layers of the MTJ element relative to a major plane of the tunnel barrier layer. The switching field of the MTJ element with the perpendicular magnetization does not require specific shape of the junction and marginally depends on a junction size. Hence, the switching field of the MTJ elements across the MRAM array has a high uniformity. The demagnetizing field in magnetic layers with the perpendicular anisotropy decreases with the reduction of the junction size resulting in an increase of the MTJ element stability. A use of a conductive magnetic flux guide reduces a write current and prevents unwanted magnetization reversal in the MTJ elements along the energized addressing lines.

BRIEF SUMMARY OF THE INVENTION

The memory cell according to the present invention includes a MTJ element and a magnetic flux guide electrically connected in series with a selection device, such as a transistor or similar non-linear element, and conductive lines. The MTJ element consists of a pinned magnetic layer and free magnetic layer with easy axis of magnetization oriented perpendicular to a major plane of the layers. A tunnel barrier layer is interposed between the pinned and free layers. The pinned layer has coercivity superior than that of the free layer.

The magnetic flux guide consists at least of a bottom magnetic portion and a top magnetic portion with the MTJ element positioned between the portions. The magnetic flux guide provides an effective magnetic flux supply to the MTJ element for reducing a write current in a "write" mode or an excitation current in a "read" mode of operation. The magnetic flux guide is made of a conductive magnetic material having a high magnetic permeability and a low electrical resistivity. The pinned and free layers of the MTJ element are magnetically isolated from the magnetic flux guide by thin non-magnetic conductive spacers. This prevents undesirable effects of the magnetic flux guide on a magnetic state of the pinned and free layers.

Each memory cell employs a pair of conductive read lines and pair of conductive write lines. The pair of the conductive read lines includes a bit line and word line, which are orthogonal to one another, spaced from each other in a vertical direction and form an intersection region. The pair of the conductive write lines includes a write line and excitation lines, which are orthogonal to one another, electrically isolated from one another, positioned in a vertical space between the intersecting pair of the conductive read lines and define a corner at their intersection. The MTJ memory element along with the magnetic flux guide is arranged at the intersection region of the pair of the conductive read lines in a vertical space between the read lines and in the corner defined by the intersecting pair of the conductive write lines. The magnetic flux guide can further include a magnetic cap. The magnetic cap and the bottom magnetic portion can overhang fractions of the conductive write lines at their intersection region to enhance efficiency of the magnetic flux guide. One of the conductive read lines; for instance, the bit line can contact the MTJ element through the magnetic flux guide. The other conductive read lines; for instance, the word line is connected to the non-linear element. The write and excitation lines are position in the vicinity of the MTJ memory element and the magnetic flux guide, and are electrically isolated from them. The pairs of the conductive read and conductive write lines are co-parallel to one another, for instance, the bit line can be parallel to the write line and the word line can be parallel to the excitation line and vice-versa. All the lines are electrically isolated from one another.

The MTJ memory cell according to the present invention can have several embodiments, which are not limited to the following:

to enhance spin-dependent tunneling, the MTJ element can employ at least one spin polarizing layer, which can be positioned on one or both sides of the tunnel barrier layer between the tunnel barrier layer and one or both magnetic layers;

to stabilize domain structure of the pinned layer for reducing addressing errors, the MTJ element can employ an antiferromagnetic layer having direct contact with the pinned layer and providing an antiferromagetic exchange coupling with the pinned layer;

to increase memory cell density in the MRAM array, at least one of the read conductive lines can have a multilayer structure being composed at least of one magnetic conductive layer and one non-magnetic conductive layer having the magnetic conductive layer being positioned adjacent the MTJ element or the magnetic flux guide.

Switching field of TMJ memory element with perpendicular orientation of magnetization in the free and pinned layers has a marginal dependence on a junction size. This results from a weak dependence of the demagnetizing field in the pinned and free layers with a perpendicular anisotropy on the junction size. Therefore, the MRAM arrays with MTJ cells according to the present invention can have high density; high magnetic stability, low error rate and high reliability. Positioning of the MTJ memory element between portions of the magnetic flux guide allows substantial reduction of the write current.

The following illustrate the objects and advantages of the present invention. The objects and advantages are provided here by way of examples, and not by way of limitation.

Further objects, features and advantages of the present invention will become apparent from the following description of the preferred embodiments with reference to the attached drawings in which reference numbers indicate similar elements. In the drawings closely related figures have the same number but different alphabetic suffixes.

DETAILED DESCRIPTION OF THE PREFERRED EMBODIMENTS

A MTJ memory cell of the present invention utilizes a phenomenon of a tunneling giant magnetoresistance in sandwiched magnetic and insulating layers. The memory cell employs a MTJ memory element formed by two magnetic layers with perpendicular anisotropy having different coercive forces, which are separated by a thin insulating layer as a tunneling barrier.

Figure 1A:
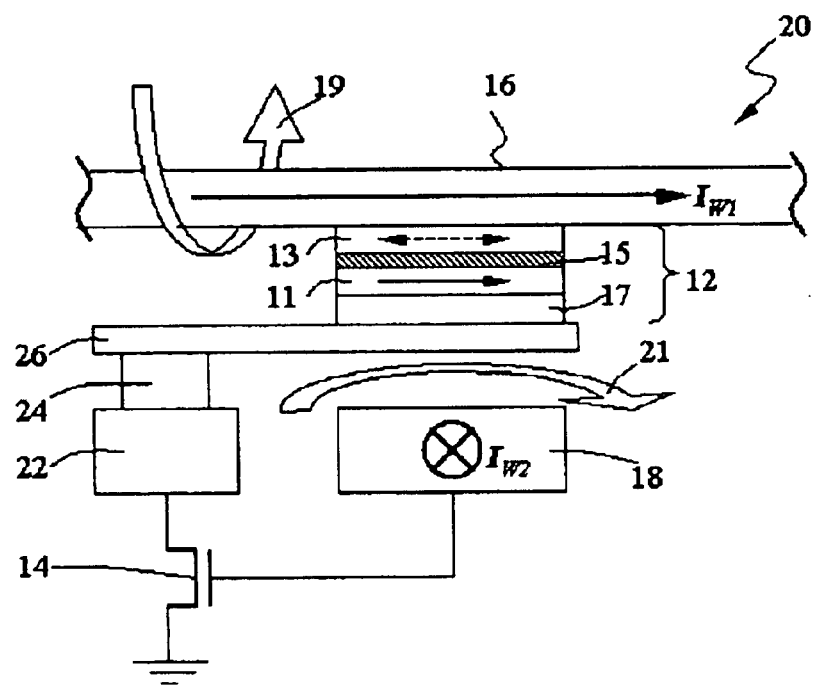
FIGS. 1A and 1B illustrates a schematic sectional view of a conventional MTJ memory cell of a MRAM array with in-plane orientation of magnetization in pinned and free layers in a "write" and "read" mode of operation, respectively.
Figure 1B:
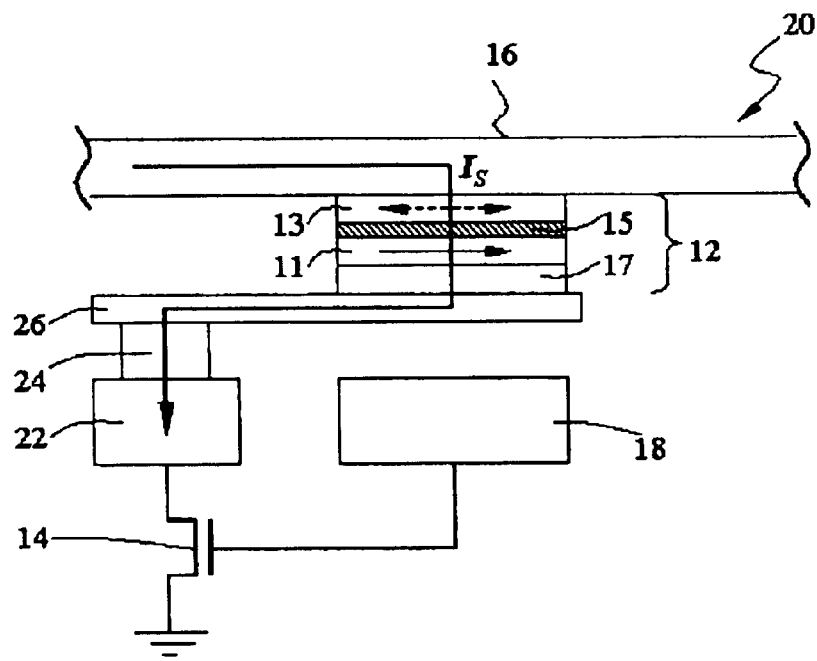
Figure 2A:
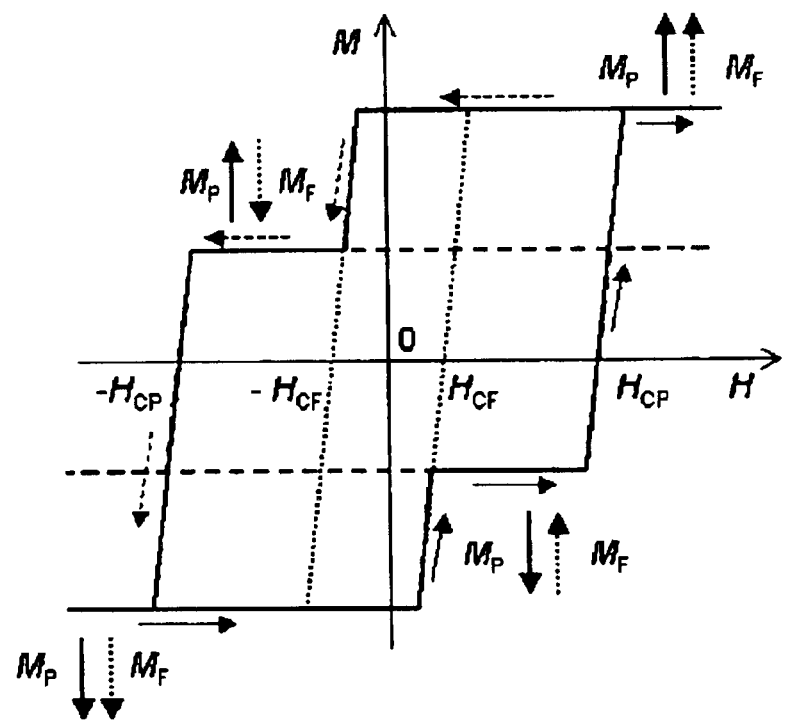
FIGS. 2A and 2B illustrate a MH-loop and an RH-curve of MTJ element with perpendicular anisotropy in the free and pinned layers according to the present invention.
Figure 2B:
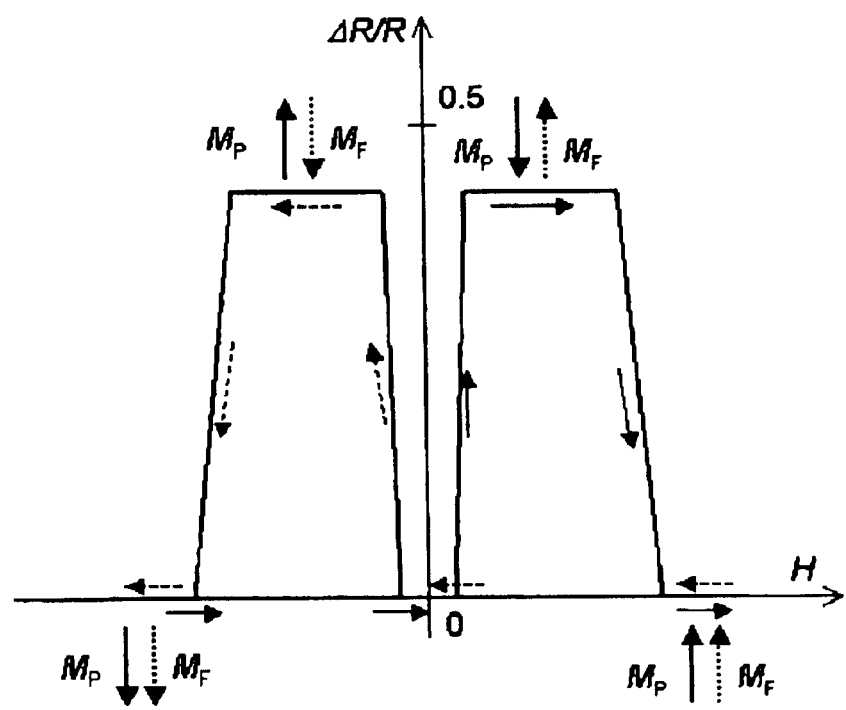

FIGS. 2A and 2B illustrate a MH-loop and a MR-curve of the MTJ element with the perpendicular anisotropy in the free and pinned magnetic layers when an external magnetic is applied perpendicular to a major plane of the layers. $H_{CF}$ and $H_{CP}$ is a coercivity of the free and pinned layers, respectively. Arrows denote orientation of the magnetization in the pinned and free layers. The dot arrow corresponds to the magnetization orientation in the free layer. The dash arrow represents the orientation of the magnetization in the pinned layer. A dot line in the FIG. 2A represents a MH-loop of the free layer. A dash line gives the MH-loop of the pinned layer. The solid line represents a combined MH-loop of the MTJ element composed of the pinned and free layers having different coercivity. The FIG.2B shows an equivalent RH-loop of the MTJ element composed of the free and pinned layers.

According to the FIGS. 2A and 2B, the MTJ element has four stable magnetic states. Two of them with a parallel orientation of the magnetization in the pinned and free layers correspond to a low resistance state (or logic "0"). The other two states with the anti-parallel orientation of the magnetization in the free and pinned layers correspond to the high resistance state (or logic "1"). The mutual orientation of the magnetization if the layers can be changed by an external magnetic field applied perpendicular to the major plane of the layers. The coercivity of the free layer $H_{CF}$ is lower than that of the pinned layer $H_{CP}$. Hence, the orientation of the magnetization in the fee layer will change first when the external magnetic field is applied. The relative variation of the resistance between these two states may be up to 40% by appropriate selection of materials and their thickness.

Figure 3:
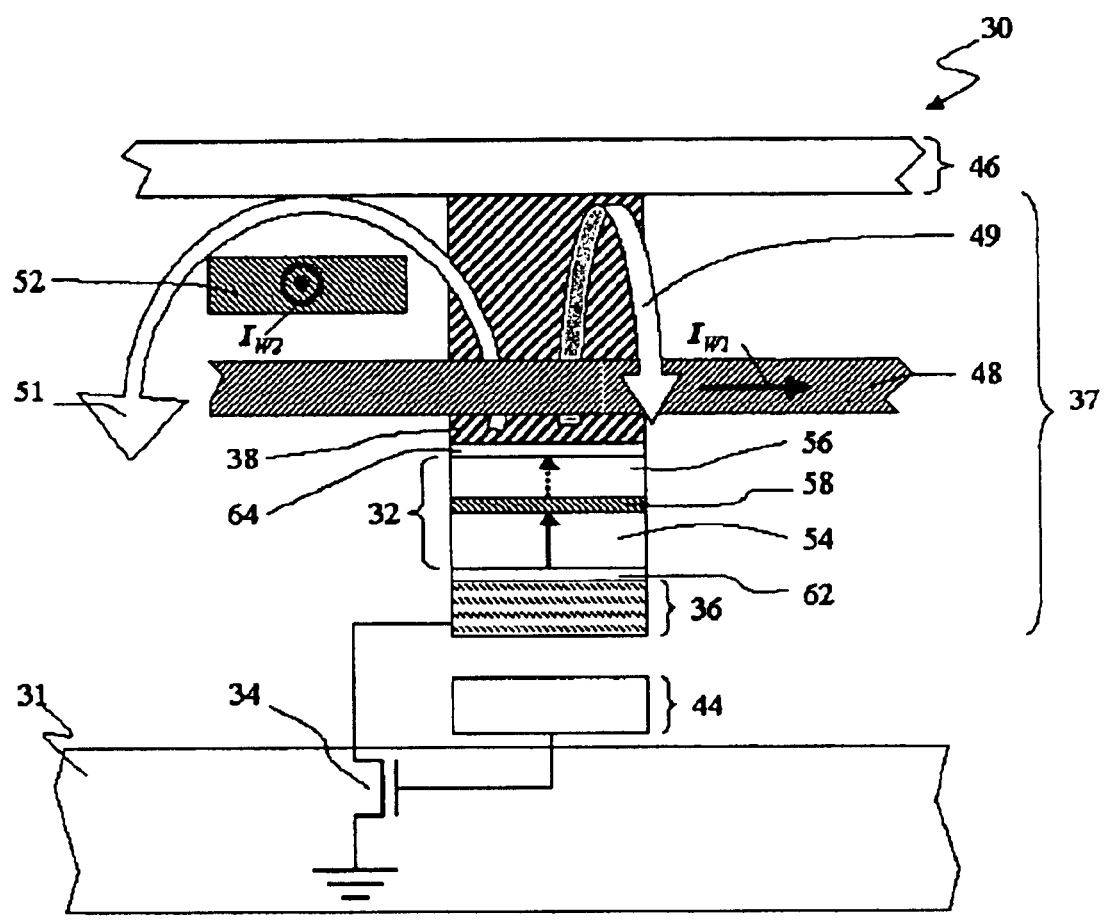
FIG. 3 is a sectional side view of a first preferred embodiment of a MTJ memory cell according to the present invention in the "write" mode of operation.
Figure 4:
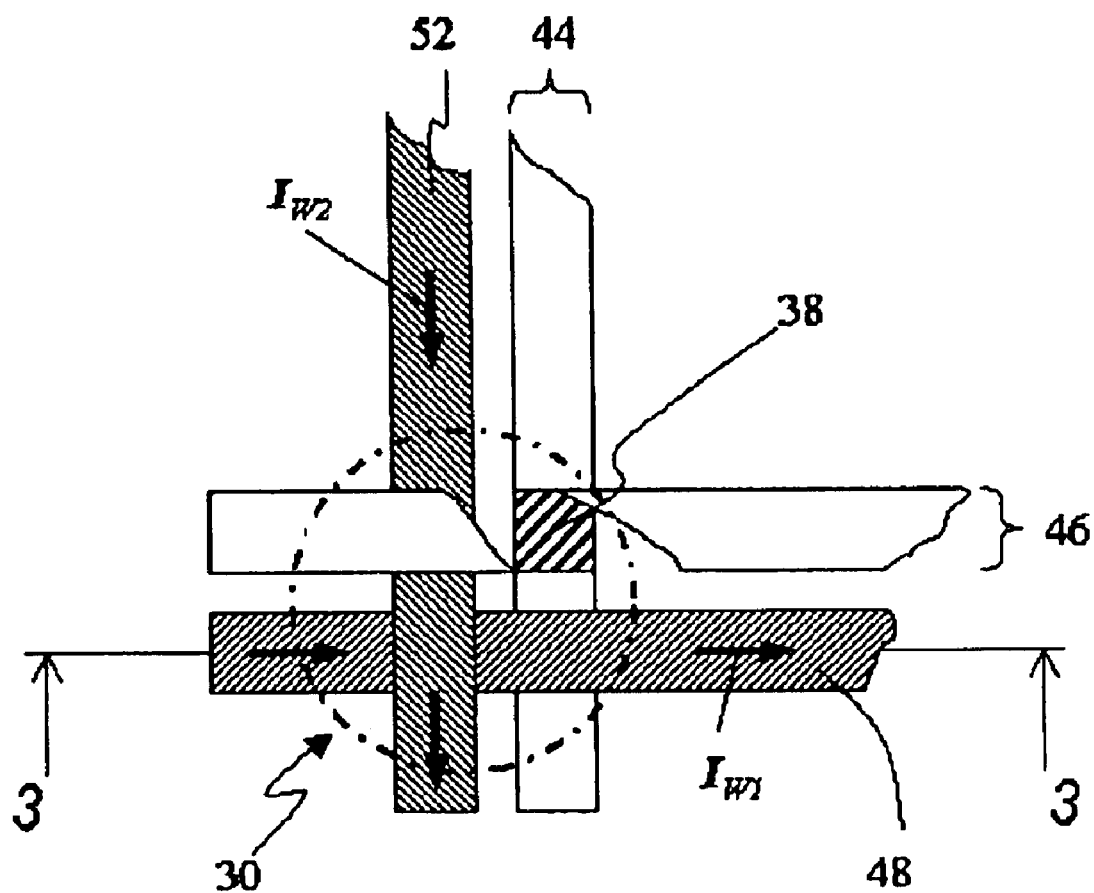
FIG. 4 is a top-down view of the first preferred embodiment of the MTJ memory cell according to the present invention shown in FIG. 3.

A first preferred embodiment of the MTJ memory cell according to the present invention is illustrated in FIG. 3 (a sectional side view) and FIG. 4 (a top-down view). A memory cell 30 is formed on a substrate 31. The memory cell 30 comprises a MTJ memory element 32, a conductive magnetic flux guide 37, a transistor 34, a pair of conductive read lines 44 and 46, and a pair of conductive write lines 48 and 52. The conductive read lines 44 and 46, and the conductive write lines 48 and 52 are preferably are made of copper (Cu) and electrically isolated from each other by silicon dioxide ($SiO_2$) (not shown). The magnetic flux guide 37 includes a bottom magnetic portion 36 and a top magnetic portion 38 with the MTJ memory element 32 positioned between them.

The memory element 32 includes a pinned magnetic layer 54, a free magnetic layer 56, and a tunnel barrier layer 58 of alumina ($Al_2O_3$) interposed between the pinned 54 and free 56 layers. The MTJ memory element 32 is magnetically separated from the portions 36 and 38 of the magnetic flux guide 37 by non-magnetic conductive spacers 62 and 64 made of 10 nm thick platinum (Pt) film, which are placed on the both sides of the MTJ memory element 32. This restrains undesirable effects of the magnetic flux guide 37 on a magnetic state of the pinned 54 and free 56 layers. Moreover, the non-magnetic spacer 62 made of Pt provides an effective control of magnetic and crystalline properties of the pinned layer 54.

The magnetic pinned layer 54 and magnetic free layer 56 have an easy axis of magnetization oriented perpendicular to a major plane of the layers. The layers 54 and 56 are made of $(CO_{0.5}/Pt_{1.5})_n$ multilayers, where n is a number of $Co_{0.5}/P_{1.5}$ repeats. The number of the repeats can be n=6 in the pinned layer 54 and n=4 in the free layer 56. Layers of Co in the repeats of the pinned 54 and free 56 layers are positioned adjacent the tunnel barrier layer 58. The magnetization in the pinned 54 and free 56 layers has two stable states either "up" or "down". The coercivity of the free magnetic layer 56 is about 200 Oe that is less than the coercivity of the pinned magnetic layer 54, which is about 600 Oe. As a result, the pinned layer 54 requires a stronger external magnetic field to change the magnetization orientation from "up" to "down" state or vice-versa than that to reverse the magnetization orientation in the free layer 56. So, the orientation of magnetization in the free layer 56 can be changed by a relatively small external magnetic field without affecting the magnetic state of the pinned layer 54. The orientation of the arrows shown in FIG. 3 (both "up") represents a parallel configuration of the magnetization in the magnetic layers 54 and 56. This orientation corresponds to a low state of the resistance of the MTJ memory element 32 (logic "0"). The pinned layer 54 is placed under the free layer 56. However, the order of the pined 54 and free 56 magnetic layers in the stack of the MTJ memory element 32 can be any.

FIG. 4 shows a top-down view of the memory cell 30. The conductive lines 44 and 52, and 46 and 48 are co-parallels. The pair of the conductive read lines includes a word line 44 and a bit line 46, which are preferably orthogonal to one another, intersect one another at an intersection region and spaced from one another in a vertical direction. The pair of the conductive write lines includes a write line 48 and an excitation line 52, which are also preferably orthogonal to one another, electrically isolated from one another and positioned in the vertical space between the intersecting pair of the conductive read lines 44 and 46. The bit line 46 is connected in series with the MTJ memory element 32, the conductive magnetic flux guide 37 and the transistor 34. The read line 44 is coupled to a gate of the transistor 34. The magnetic flux guide 37 and the memory element 32 are arranged at the intersection region of the pair of the conductive read lines 44 and 46 in the vertical space between the lines. In addition, the memory element 32 is positioned in the vicinity of a corner defined by the intersecting pair of the conductive write lines 48 and 52. The word 44 and bit 46 lines, as well the write 48 and excitation 52 lines may replace one another, for example, the bit line 46 can serve as the word line 44 and the word line 44 can serve as the bit line 46.

Figure 5:
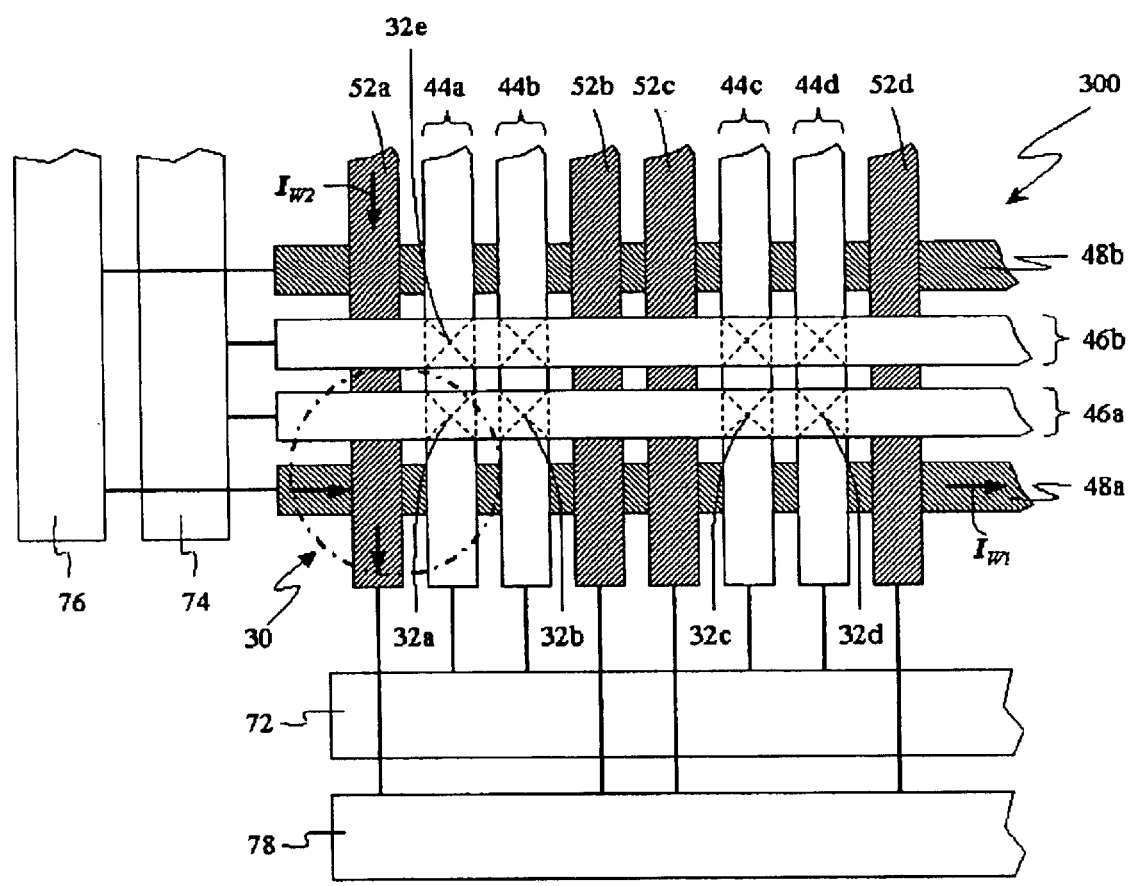
FIG. 5 is a top-down view of a portion of a MRAM array composed of the memory cells according to the first preferred embodiment of the present invention given in FIG. 3 and FIG. 4.

FIG. 5 provides a top-down view of a portion of a MRAM array 300 composed of the memory cells 30 shown in FIGS. 3 and 4. The word lines 44a–d extend along columns of the MTJ memory elements 32a–e (marked as crosses). The bit lines 46a–b extend along rows of the MTJ memory elements. Besides the word and bit lines, the memory array 300 comprises the excitation lines 52a–d and the write lines 48a–b. The excitation lines 52a–d are arranged in parallel to the word lines 44a–d. The write lines 48a–b are arranged in parallel to the bit lines 46a–b. The bit 46a–b and word 44a–d lines are intersect each other at a plurality of the intersection regions and are spaced from each other in a vertical direction. The excitation 52a–d and write 48a–b lines also intersect each other, electrically isolated from each other and are positioned in the vertical space between the intersecting bit and word lines. The intersecting excitation and write lines define plurality of corners. The MTJ memory elements 32a–e are positioned at the intersections regions of the word and bit lines, and in the corners defined by the intersecting excitation and write lines. The plurality of the word lines 44a–d is connected to a first read circuitry 72. The plurality of the bit lines 46a–b is coupled to a second read circuitry 74. The write lines 48a–b and the excitation lines 52a–d are connected to a first write circuitry 76 and a second write circuitry 78, respectively. The read circuitries 72 and 74 and the write circuitries 76 and 78 control an operation of the MRAM array 300 in the "read" and "write" modes applying signals of a predetermined polarity and magnitude.

Fabrication Process for the Memory Cell

Preferred materials, thickness, and process steps of the MTJ cell 30 are described with the reference to the FIGS. 3–5. The MRAM array 300 is formed on a planar surface of a silicon wafer 31 covered by an insulating layer of $SiO_2$ (not shown). The wafer 31 includes the earlier formed transistor 34. The word line 44 made of Cu and the bottom magnetic portion 36 made of $Ni_{79}Fe_{21}$-alloy are formed on the substrate 31 one after another. They are electrically isolated from one another and covered with a insulating layer of $SiO_2$ (not shown). Then, a top surface of the insulating $SiO_2$ layer is planarized by a chemical-mechanical polish (CMP) to expose a top surface of the bottom portion 36 of the magnetic flux guide 37. The MTJ memory element 32 is formed on the common planar surface composed by the $SiO_2$-layer and the bottom magnetic portion 36. Next, series of layers, which include the nonmagnetic spacer 62, the MTJ memory element 32, the non-magnetic spacer 64 and a layer of $Ni_{79}Fe_{21}$, are deposited by a vacuum sputter deposition. The layer of $Ni_{79}Fe_{21}$ represents a bottom part of the top magnetic portion 38.

In order, the 10 nm thick platinum (Pt) spacer 62, the $(Co_{0.5}/Pt_{1.5})_6/Co_{0.5}$ pinned layer 54 are deposited. On a top of the pinned layer 54, 1 nm of Al is deposited and oxidized in a vacuum chamber with an oxygen enriched atmosphere and elevated temperature to form the insulating tunneling barrier layer 58 of $Al_2O_3$. Then, the free magnetic layer 56, the non-magnetic conductive spacer 64, and the bottom part of the top magnetic portion 38 are deposited. The free layer 56 is formed of the $(Co_{0.5}/Pt_{1.5})_4$ multilayers with the Co-layer facing the tunnel barrier layer 58 of $Al_2O_3$. A 0.1-$\mu$m thick layer of $Ni_{81}Fe_{19}$ covers the spacer 64 made of 10 nm thick Pt layer. At this point, there is a single large MTJ memory element that covers the entire surface of the substrate. This large MTJ element is then patterned into many small MTJ memory elements similar to the element 32 by photoresist masking and ion milling down through the stack of the layers to the CMP planarized top surface of the bottom magnetic portion 36 and the insulating layer of $SiO_2$. State-of-the-art silicon VLSI processes are then used to form write 48 and excitation 52 lines in an insulator of $SiO_2$ (not shown) and opened a contact hole in $SiO_2$ to the 0.1-$\mu$m thick layer of $Ni_{81}Fe_{19}$ that covers the non-magnetic spacer 64. Electroplating of $Ni_{81}Fe_{19}$ alloy into the contact hole forms the top magnetic portion 38 of the flux guide 37. Another CMP process is applied above the surface of $SiO_2$ to expose a top surface of the top magnetic portion 38. Then, the bit line 46 of Cu is formed on a common planar surface of $SiO_2$ and the top magnetic portion 38 using state-of-the-art silicon VLSI processes. The bit line 46 has direct electrical contact with the MTJ memory element 32 through the electrically conductive top portion 38 of the magnetic flux guide 37.

Operation of the Memory Cell

MTJ memory elements of the present invention may have two "write" and two "read" modes of operation. The mode of operation depends on a strength of a magnetic fringing field produced by the magnetic pinned layer 54 relative to the coercivity of the free layer 56. The fringing field is produced by magnetic charges accumulated on a surface of the pinned layer 54 that is adjacent the free layer 56. If the fringing field of the pinned layer 54 is less than the coercivity of the free layer 56, the information can be stored in the free layer 56 of the MTJ memory element 32. At this condition, the fringing field upon writing completion will not reverse the orientation of magnetization in the free layer 56. However, if the coercivity of the free layer 56 is less than the fringing field of the pinned layer 54, the orientation of magnetization in the free layer 56 can be forced by the fringing field in parallel to the orientation of magnetization in the pinned layer 54 when the write current is removed. At this condition, the information can be written to the pinned layer 54 of the MTJ memory element 32.

The "write" mode of operation of the memory cell 30 is described with a reference to FIGS. 3 and 4. In the "write" mode the transistor 34 is blocked applying an appropriate bias signal to its gate through the word line 44. Writing to the MTJ memory element 32 is accomplished by passing simultaneously write currents $I_{W1}$ and $I_{W2}$ through the intersecting write line 48 and excitation line 52, respectively. The currents $I_{W1}$ in the write line 48 and $I_{W2}$ in the excitation line 52 generate magnetic fields 49 and 51, respectively. The magnetic fields 49 and 51 have the same polarity and are concentrated in the magnetic flux guide 37 that has a high magnetic permeability. The fields 49 and 51 are applied perpendicular to the major plane of the free 56 and pinned 54 layers.

When the coercivity of the free layer 56 is greater than the fringing field of the pinned layer 54, the information is written to the free layer 56. The magnetic field produced by either $I_{W1}$ or $I_{W2}$ alone in the MTJ memory element 32 is less than the magnetic field required to change the orientation of magnetization in the free layer 56. Therefore, half-selected elements 32b–e schematically shown in FIG. 5, those over which only $I_{W1}$ or $I_{W2}$ alone is passing, are not written. However, the combination of magnetic fields from the currents $I_{W1}$ and $I_{W2}$ is sufficient to write to the free layer 56 of the selected memory element 32a, which is positioned in a corner defined by the intersecting write 48a and excitation 52a lines. A strength of the combined magnetic field is selected to be superior the coercivity of the free layer 56 and less than the coercivity of the pinned magnetic layer 54. In principal, only the memory element 32a located at the intersection of the write line 48a and excitation line 52a is subject to magnetization reversal in the free layer. Separately magnetic fields produced by write line 48a and excitation line 52a are insufficient to cause reversal of magnetization in the free layer of the elements 32b–e. The magnetic flux guide promotes a strength of the write magnetic field affecting the memory element and allows a reduction of the write currents.

If the fringing field of the pinned layer 54 exceeds the coercivity of the free layer 56, the orientation of magnetization in the pinned 54 and free 56 layers coincide (both "up" or both "down") when the write currents are removed. At this condition, the information can be written to the pinned layer 54 of the MTJ memory element 32. The strength of the combined magnetic field produced by two write currents $I_{W1}$ and $I_{W2}$ simultaneously should exceed the corcivity of the pinned layer 54. Therefore, separately strength of the fields 49 and 51 should be less than the pinned layer coercivity to restrain magnetization reversal in half-selected elements 32b–e.

Likewise the "write" modes, the MTJ memory elements according to the present invention can have two "read" modes of operation. The "read" mode of the memory cell 30 is described with reference to FIG. 6. In the "read" mode the transistor 34 is opened applying an appropriate signal to its gate through the word line 44. A sense current $I_S$ in the transistor 34 is at a maximum. The sense current $I_S$ flows through the bit line 46, the top magnetic portion 38, the MTJ element 32, the bottom magnetic portion 36, and the opened transistor 34. This current $I_S$ enables the resistance of the MTJ element 32 to be measured. If the information was written to the free layer 56, the resistance of the MTJ element 32 depends on the magnetization orientation in the free layer 56 relative to the fixed magnetization orientation in the pinned layer 54. By comparison the resistance of the MTJ memory element 32 with a reference MTJ memory element (not shown), the state of the given memory cell ("1" or "0") can be determined.

Figure 6:
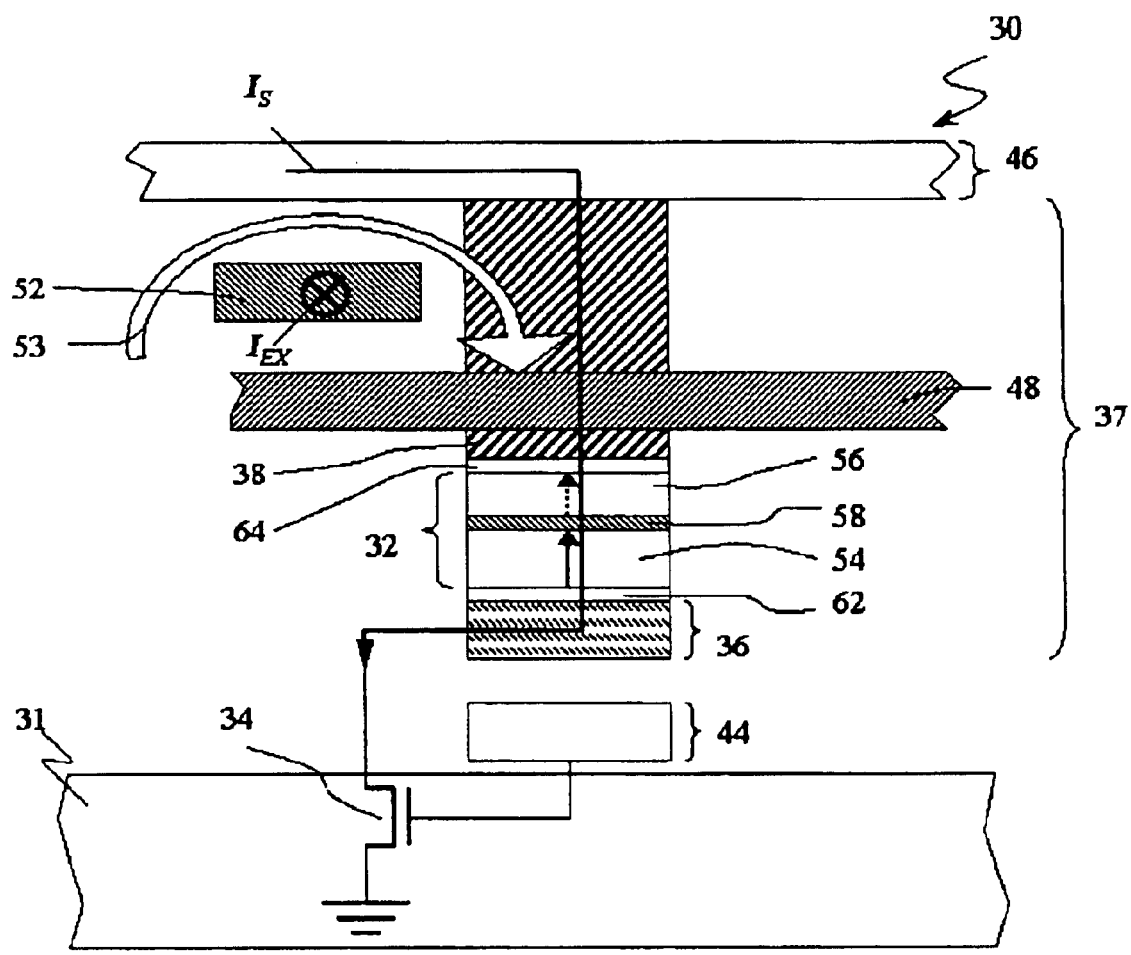
FIG. 6 is a sectional side view of the first preferred embodiment of the MTJ cell according to the present invention in the "read" mode of operation

If the information was written to the pinned layer 54, the "read' mode requires use of the excitation current $I_{EX}$ in the excitation line 52 (FIG. 6). The excitation current $I_{EX}$ produces the excitation magnetic field 53 of the predetermined polarity and strength. The strength of the excitation field is insufficient to reverse the orientation of magnetization in the pinned layer 54 to where the information was written. However, the excitation field 53 is strong enough to overcome the fringing field of the pinned layer 54 and to orient the magnetization in the free layer 56 in parallel to the excitation field 53. The magnetic state of the MTJ memory cell 30 ("0" or "1") can be identified comparing resistance of the element 32 with that of the reference memory element (not shown).

In the described above the first preferred embodiment, the word line 44 can also be referred to as a first electrically conductive line, while the bit line 46 can also be referred to as a second electrically conductive line. As will be appreciated, both the first electrically conductive line 44 and the second electrically conductive line 46 can be positioned at any number of locations relative the MTJ memory element 32. The write line 48 can also be referred to as a third electrically conductive line, while the excitation line 52 can also be referred to as a fourth electrically conductive line. The write line 48 and the excitation line 52 are arranged between the intercepting word line 44 and bit line 46 adjacent the MTJ memory element 32. All the lines are electrically isolated from one another.

FIGS. 7–15 illustrate several preferred alternative embodiments of the present invention, which employ similar modes of operation and manufacturing processes.

Figure 7:
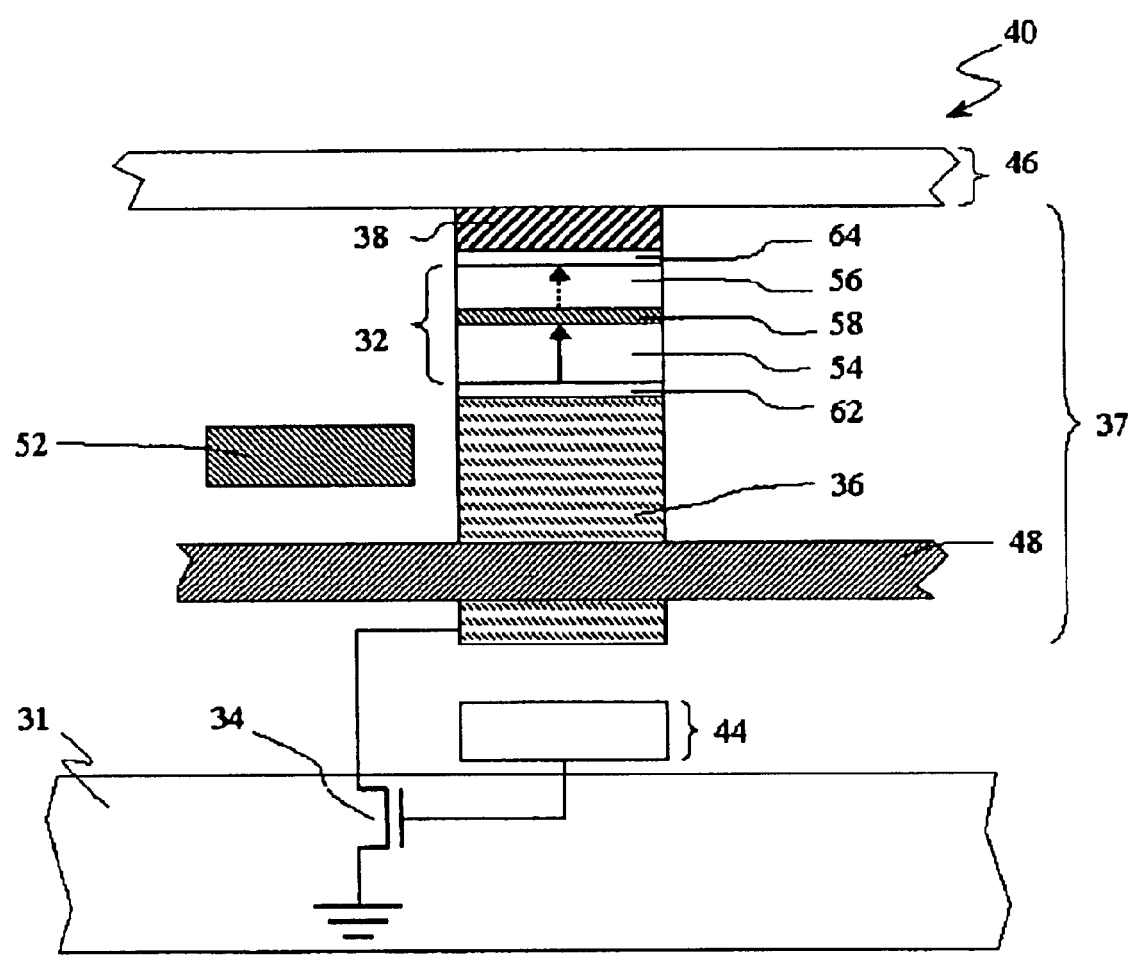
FIG. 7 is a sectional side view of a second preferred embodiment of a MTJ memory cell according to the present invention.

FIG. 7 shows a second preferred embodiment according to the present invention. In the memory cell 40 the bottom portion 36 of the magnetic flux guide 37 is made thicker than the top portion 38. As a result, the MTJ memory element 32 is positioned above the write 48 and excitation 52 lines. This design can have higher yield since the MTJ memory element 32 is formed at a final stage of a manufacturing process after formation of the write 48 and excitation 52 lines.

Figure 8:
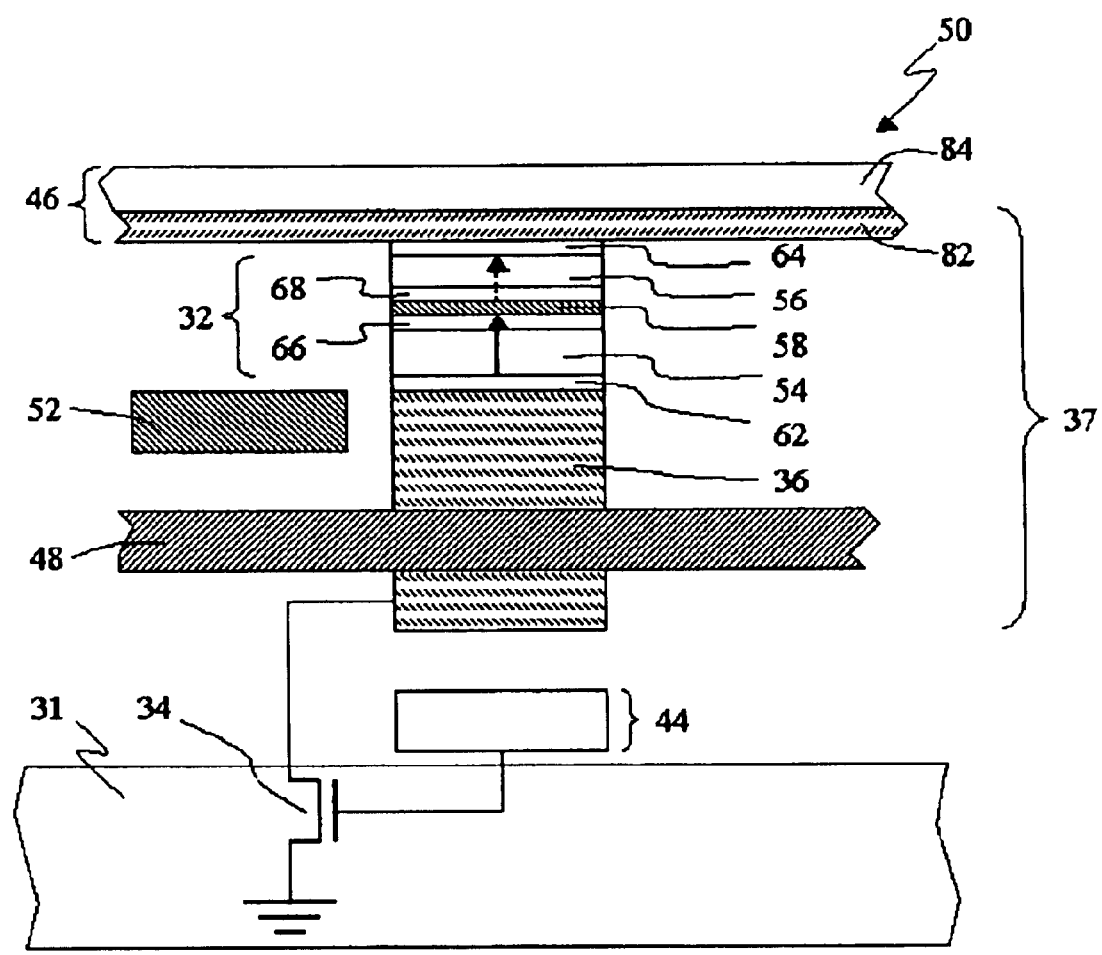
FIG. 8 is a sectional side view of a third preferred embodiment of a MTJ memory cell according to the present invention.

FIG. 8 illustrates a third preferred embodiment according to the present invention. In the memory cell 50 the bit line 46 is made of multiplayer and comprises at least two electrically conductive layers 82 and 84. The layer 82 is made of magnetic material having a high permeability, for instance of $Ni_{81}Fe_{19}$, which is positioned adjacent the bottom magnetic portion 36. The bottom magnetic portion 36 and the magnetic layer 82 compose the magnetic flux guide 37. The MTJ memory element 32 is positioned inside the magnetic flux guide 37. The layer 84 can be made of Cu. The top surface of the bottom magnetic portion 36 is planarized by CMP. The MTJ memory element 32 is magnetically separated from the bottom magnetic portion 36 and the magnetic layer 82 by non-magnetic conductive spacers 62 and 64, respectively. The pinned layer 54 can be made of 10-nm thick single layer of TbFeCo-alloy having a perpendicular anisotropy. To promote a giant magnetoresistance in the TMJ memory element 32, 1-nm thick spin-polarizing layer 66 of CoFe having a high spin polarization is placed between the pinned magnetic layer 54 and the tunnel barrier layer 58. The spin-polarizing layer 66 can be made of multilayer, such as $Pt_1/CoFe_1$ or similar with the layer of CoFe being in contact with the tunnel barrier layer 58. The free layer 56 can be made of 5-nm thick single layer of GdFeCo-alloy with a spin-polarizing layer 68 sandwiched between the free layer 56 and the tunnel barrier layer 58. MRAM arrays based on the cell 50 have a high output signal in the "read" node, simplified manufacturing process and potentially higher yield.

Figure 9:
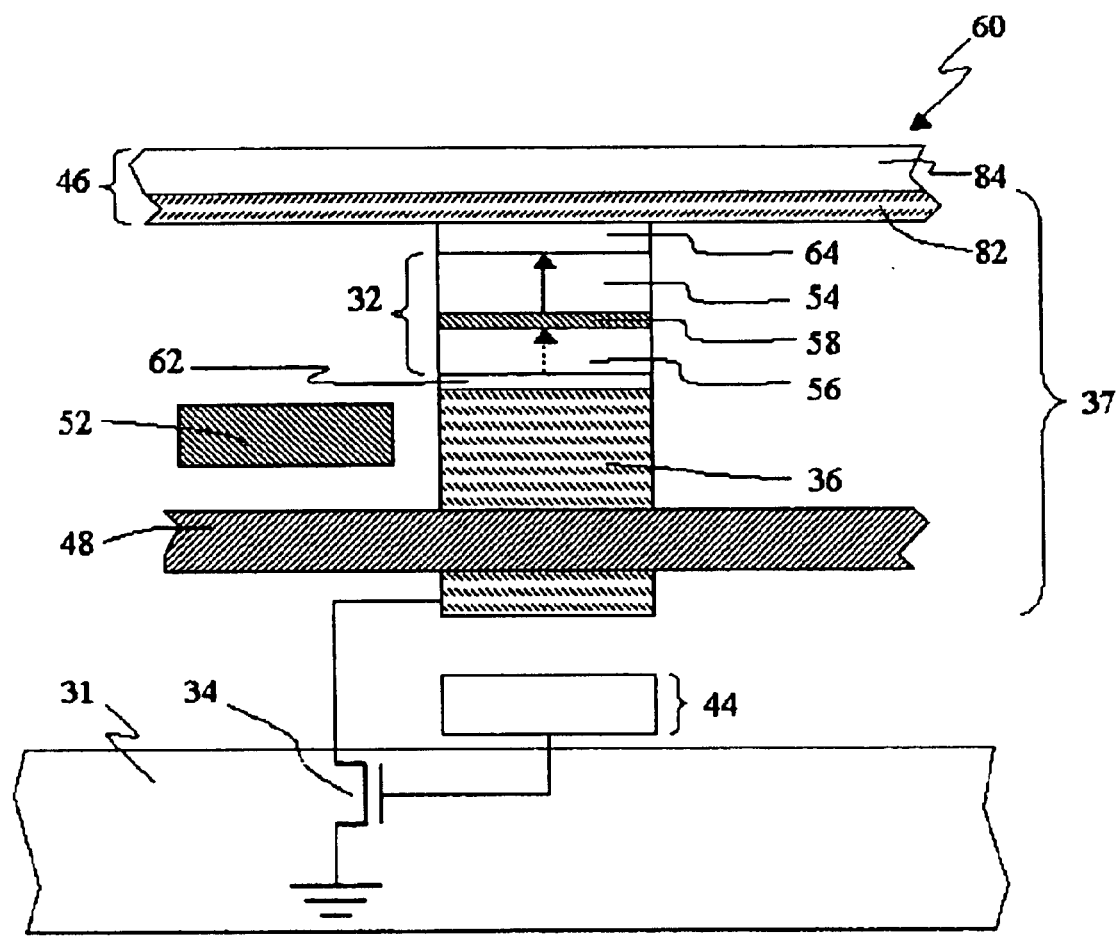
FIG. 9 is a sectional side view of a fourth preferred embodiment of a MTJ memory cell according to the present invention.

FIG. 9 shows a fourth preferred embodiment according to the present invention. The MTJ element 32 of the memory cell 60 has reversed order of the pinned 54 and free 56 layers in the stack. The free layer 56 is deposited first on the top planar surface of the bottom magnetic portion 36. A formation of the free layer 56 on the planar surface allows an effective control of magnetic properties of the free layer 56, such as a coercivity and a dispersion of a magnetic anisotropy. A reduction of the free layer coercivity facilitates switching of the free layer 56 in the "write" mode. The pinned magnetic layer 54 is placed above the free layer 56 and is separated from the free layer 56 by the tunnel barrier layer 58. The coercivity of the pinned layer 54 can be effectively controlled using an antiferromagnetic exchange coupling between the magnetic pinned layer 54 and the non-magnetic conductive spacer 64 made of an antiferromagnetic material, for instance, $Fe_{50}Mn_{50}$ alloy. A thickness of the antiferromagnetic $Fe_{50}Mn_{50}$ spacer can be of 10 nm. The exchange coupling between the magnetic pinned layer 54 and the antiferromagnetic spacer 64 improves a stability of domain structure in the pinned layer 54 and thus prevents undesirable reversal of the magnetization in the pinned layer. The MTJ memory element 32 of the memory cell 60 has a reduced write current due to a low coercivity of the free layer 56 and improved magnetic stability of the pinned layer 54.

Figure 10:
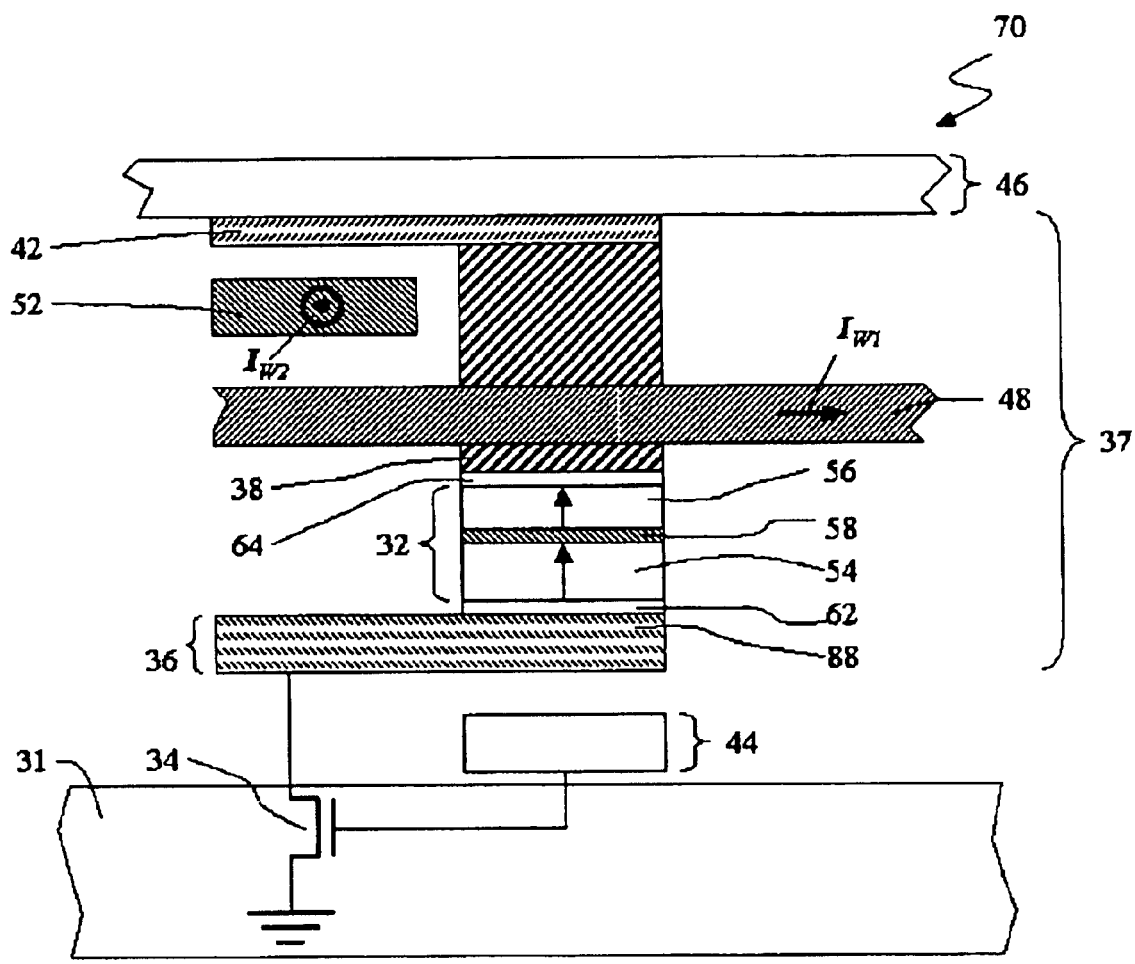
FIG. 10 is a sectional side view of a fifth preferred embodiment of a MTJ memory cell according to the present invention.
Figure 11:
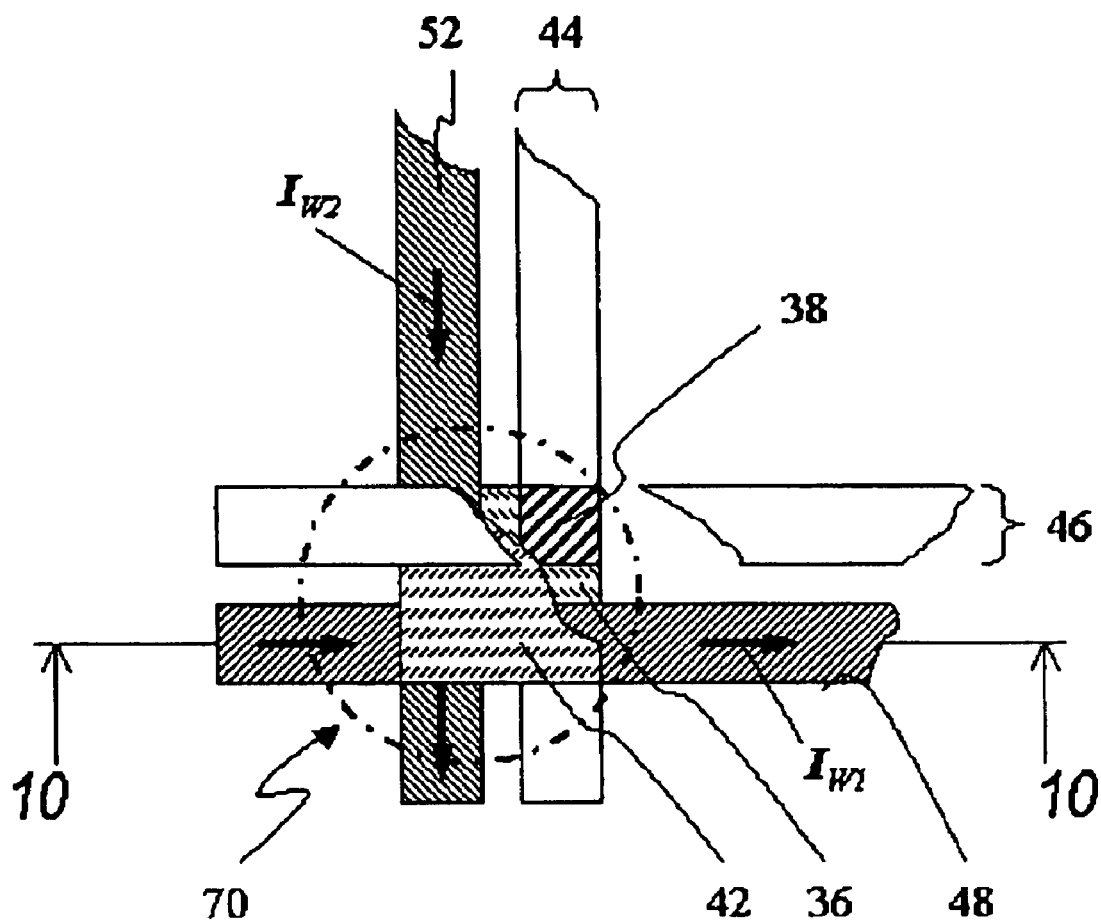
FIG. 11 is a top-down view of the fifth preferred embodiment of the MFJ memory cell according to the present invention shown in FIG. 10.
Figure 12:
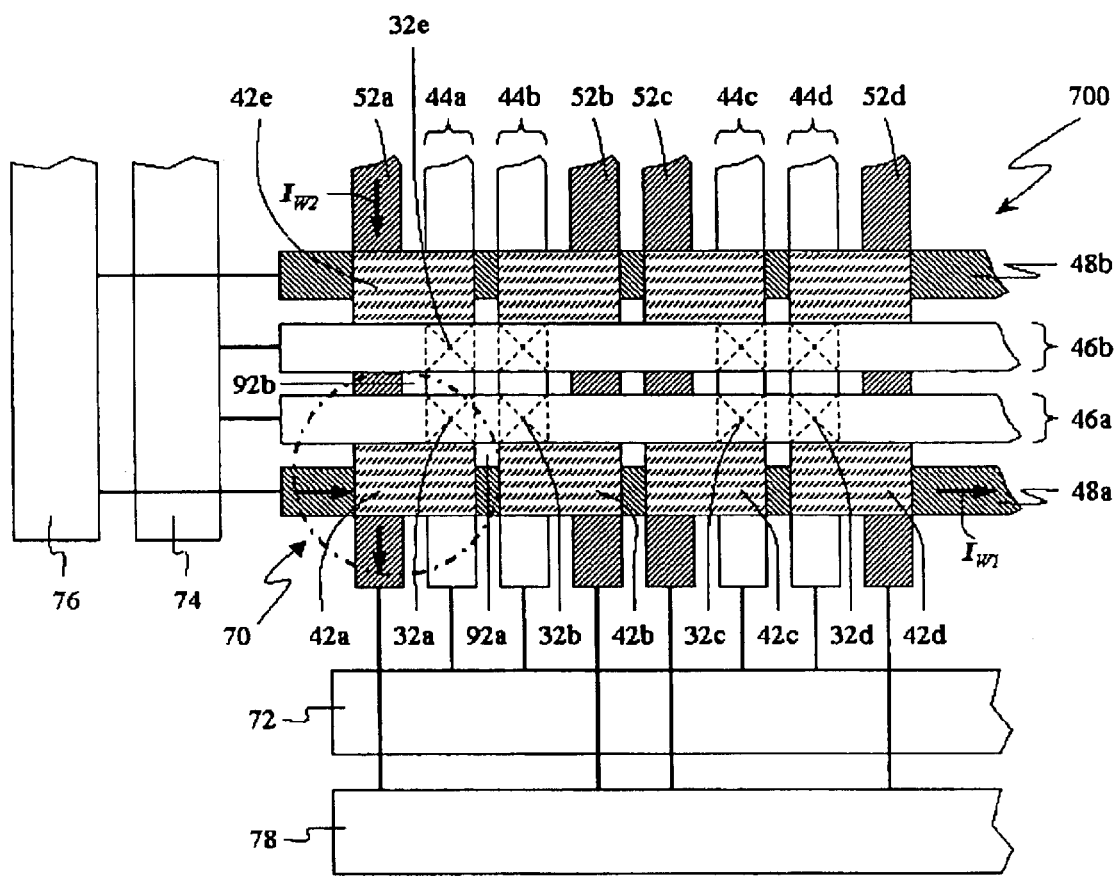
FIG. 12 is a top-down view of a portion of a MRAM array composed of the memory cells according to the fifth preferred embodiment of the present invention given in FIG. 10 and FIG. 11.

FIGS. 10–12 show a fifth preferred embodiments of the present invention. The memory cell 70 employs three pieces structure of the magnetic flux guide 37, which includes the bottom portion 36, the top portion 38 and a magnetic cap 42. The pieces 36, 38 and 42 of the magnetic flux guide 37 are preferably made of soft magnetic material such as $Ni_{81}Fe_{19}$-alloy having a high magnetic permeability and a low electrical resistivity.

The MTJ memory element 32 (not shown in FIG. 11) is positioned at an intersection region of the conductive read lines 44 and 46, and in a corner defined by the intersecting pair of the conductive write lines 48 and 52. The lines 44 and 52, and 46 and 48 are co-parallel. The bottom magnetic portion 36 and the magnetic cap 42 overhang the top magnetic portion 38 and fractions of the write lines 48 and 52 at their intersection. This improves a magnetic coupling between the write lines 48 and 52, and the magnetic flux guide 37 allowing a reduction of the write or excitation currents in the "write" or "read" mode, respectively.

A part of a MRAM array 700 composed of the cells 70 is shown in FIG. 12. The magnetic caps 42a–e of the adjacent memory cells are magnetically isolated from each other by non-magnetic gaps. For instance, the magnetic cap 42a is magnetically isolated from the adjacent magnetic caps 42b and 42e by the non-magnetic gaps 92a and 92b, respectively. Similarly, the bottom magnetic portions (not shown) of the adjacent memory cells are magnetically isolated from each other by the non-magnetic gaps.

Figure 13:
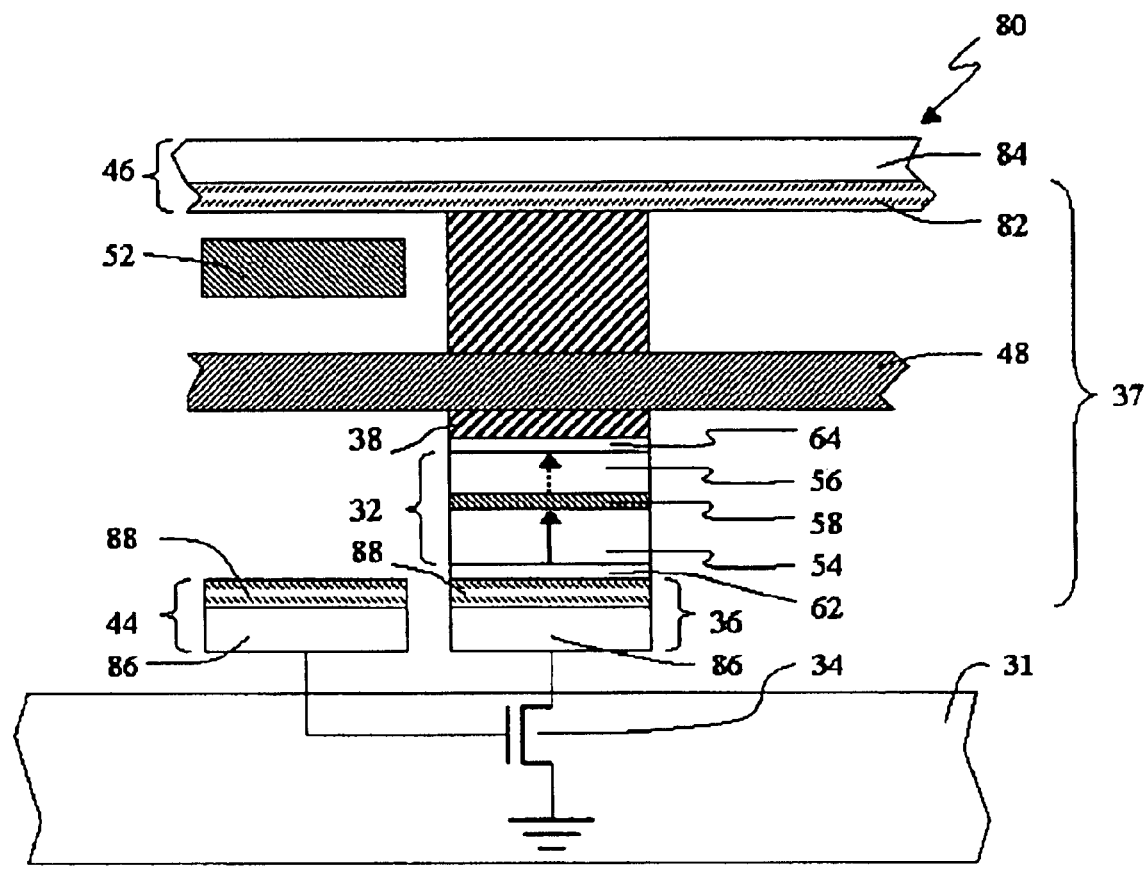
FIG. 13 is s a sectional view of a six preferred embodiment of a MTJ memory cell according to the present invention.
Figure 14:
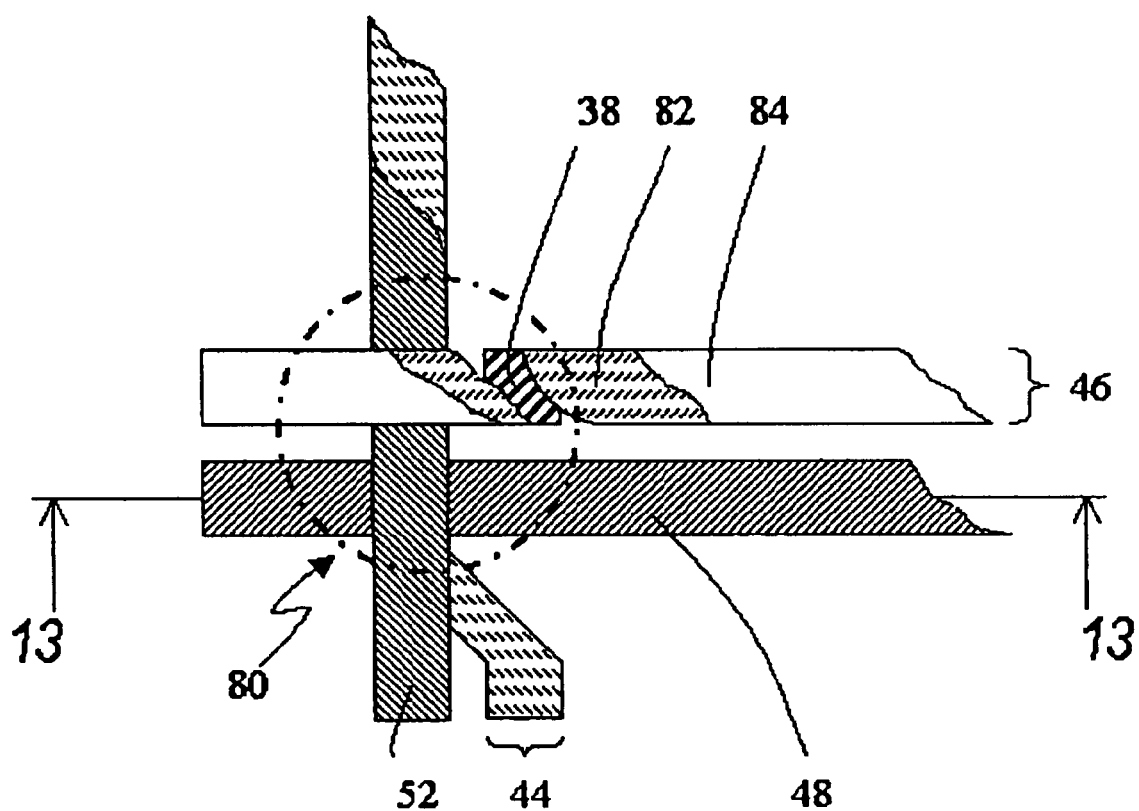
FIG. 14 is a top-down view of the six preferred embodiment of the MTJ memory cell according to the present invention shown in FIG. 13.
Figure 15:
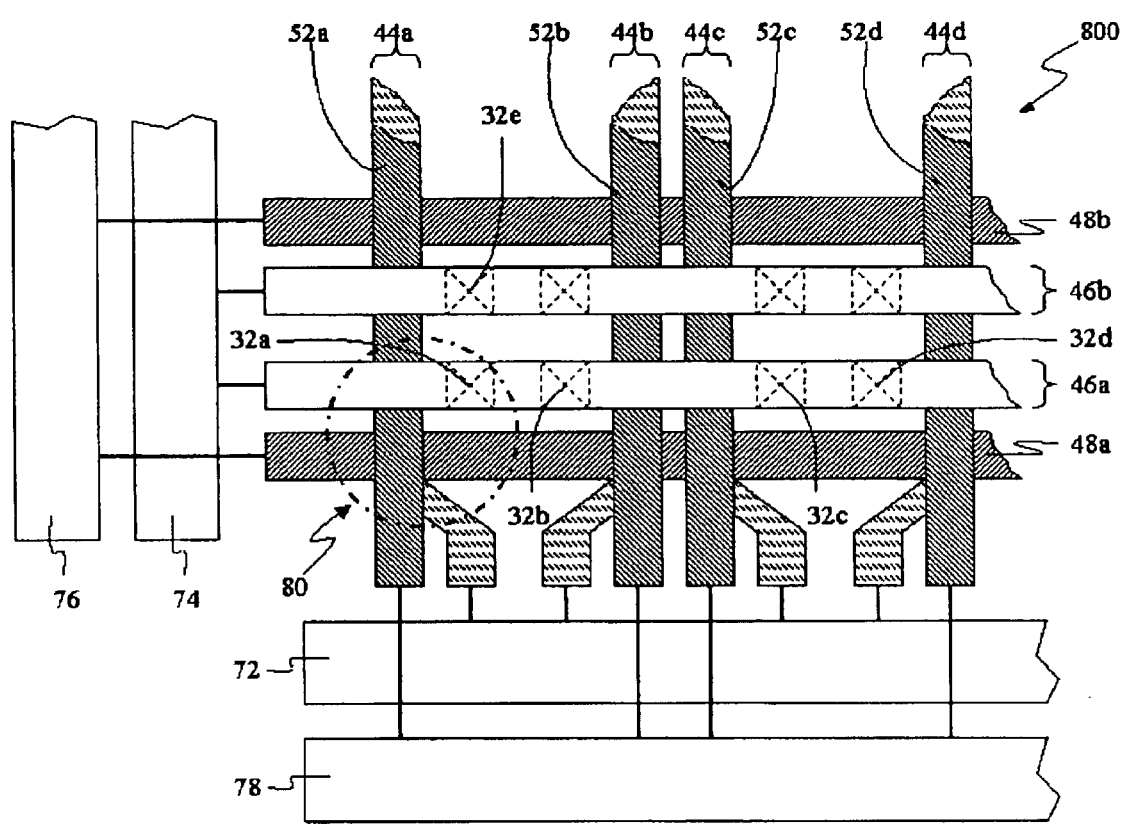
FIG. 15 is a top-down view of a portion of a MRAM array composed of the memory cells according to the six preferred embodiment of the present invention given in FIG. 13 and FIG. 14.

FIGS. 13–15 show a six preferred embodiments of the present invention. The memory cell 80 has a three pieces structure of the magnetic flux guide 37, which includes the bottom portion 36, the top portion 38 and the magnetic layer 82 of the bit line 46. The read lines 44 and 46 have a multiplayer structure and comprise at least of two conductive layers, one of them is made of magnetic material with a high permeability such as $Ni_{81}Fe_{19}$. To facilitate a manufacturing process of the memory cell 80, the bottom portion 36 of the magnetic flux guide 37 is made simultaneously with the word line 44 and also employs the multiplayer structure. The magnetic layer 82 of the bit line 46 and the magnetic layer 88 of the bottom magnetic portion 36 are positioned adjacent the MTJ memory element 32. Along with the top magnetic portion 38 they form the flux guide 37 to provide an effective supply of the signal magnetic filed to the MTJ memory element 32. Layers 86 and 84 of the word line 44 and the bit line 46 can be made of Cu, having a low electrical resistivity. A thickness of the magnetic 82, 88 and conductive 84,86 layers can be about 0.2 μm and 0.5 μm, respectively. The word line 44 of the memory cell 80 can be positioned at various places relative to the bottom 36 and top 38 magnetic portions.

While the above description contains many specifies these should not be construed as limitations on the scope and spirit of the present invention, but rather as an exemplification of the preferred embodiments. Many other variations are possible. For example, shape and dimensions of the bottom magnetic portion 36 and magnetic cap 42, a position of the conductive write lines 48 and 52, a position of the conductive read lines 44 and 46 relative to the MTJ memory element 32. As well, a number of layers in the conductive lines, in bottom and top magnetic portions of the magnetic flux guide, and in the magnetic cap can be any. The following materials can be used to form basic components of the memory cells.

The free magnetic layer 56 can be made from a group of conductive magnetic materials exhibiting a perpendicular anisotropy. These materials include but are not limited to layers or laminates based on Co, Fe, Ni, Pt, Pd, Th, Gd, B, Cr and their alloys. Specific examples of laminates and layers include, but are not limited to Co/Pt, CoFe/Pt, CoFeB/Pt, CoFe/Pd, Fe/Pt, GdFe, GdFeCo or similar. The coercivity of the free ferromagnetic layer 56 can be in a range from 50 Oe to 1000 Oe and more specifically, in a range from 100 Oe to 300 Oe. Thickness of the free layer can be from 0.2 nm to 100 nm and more specifically, from 5 nm to 20 nm.

The pinned ferromagnetic layer 54 can be made of conductive magnetic material having a perpendicular anisotropy. These materials include but are not limited to layers or laminates based on Co, Fe, Ni, Pt, Pd, Tb, Gd, B, Cr and their alloys. Specific examples of laminates and layers include, but are not limited to TbFe, TbFeCo, Co/Pt, Co/Pd, CoFe/Pt, CoFeB/Pt, CoFe/Pd, CoFeB/Pd, CoCrPt/CoFe, FePt or similar. The coercivity of the pinned magnetic layer 54 should be higher than that of the free magnetic layer 56. As a result, the coercivity of the pinned magnetic layer 54 can be in a range from 100 Oe to 5000 Oe and more specifically from 200 Oe to 600 Oe. Thickness of the pinned layer can be in a range from 0.5 nm 200 nm, and more specifically, from 10 nm to 40 nm.

The tunnel barrier layer 58 can be made of insulating or partially conductive materials. Examples of suitable materials for the tunnel barrier layer 58 include but are not limited to semiconductor films, such as Si, Ge, oxides of metallic and semiconductor films, such as $Al_2O_3$, $TiO_2$, $Ta_2O_5$, $SiO_2$, and their based alloys or metallic particles incorporated into the insulating films. The barrier layer can have single layer or multilayer structure composed of laminates of insulating and metallic films. Thickness of the tunnel barrier layer 58 can be in a range from 0.2 nm to 5 nm, and more specifically, from 1 nm to 2 nm.

In the present embodiments the bottom 36 and top 38 magnetic portions, the magnetic cap 42 and the magnetic conductive layer 82 and 88 are made of soft magnetic material having a low electrical resistivity and high magnetic permeability. Examples of materials for these magnetic elements and layers include but are not limited to alloys and laminates of Co, Fe, Ni, B, Zr, Hf, Cr, Ru, Cu, such as NiFe, CoNiFe, CoFe or similar. The bottom 36 and top 38 magnetic portions can have a thickness of approximately from 50 un to 5000 nm, and, more specifically, in a range from 100 nm to 1500 nm. Thickness of the magnetic cap 42 and magnetic layers 82 and 88 can be in a range from 50 nm to 1000 nm and, more specifically, in a range from 100 nm to 250 nm.

Materials for the spin-polarizing layers 66 and 68 include but are not limited to Co, Fe or their based alloys such as CoFe, CoFeB or similar. Thickness of the spin-polarizing layers can be in a range from 0.2 nm to 20 nm and, more specifically, from 0.4 nm to 2 nm.

The electrically conductive lines 44, 46, 48 and 52 and their conductive layers 84 and 86 discussed herein can be made of Al, Cu, Pt, Au, Ta, W, their based alloys or laminates.

The antiferromagnetic spacer 64 in the cell 60 can be made of conductive Mn-based alloys, such as FeMn, IrMn, PtMn or similar.

Embodiments of the present invention may include different forms. The description herein provides an exemplification of the principles of the invention and is not intended to limit the invention to the particular embodiments illustrated.

The structural embodiments of the present invention illustrated herein are believed to reduce accidental reversals of the magnetization in MTJ memory elements adjacent one of the write lines 48 or along one of the excitation lines 52 energized in "write" and "read" modes of operation Although the specific embodiments have been illustrated and described herein, those of ordinary skill in the art will appreciate that an arrangement calculated to achieve the same techniques could be substituted for the specific embodiments shown. This disclosure is intended to cover adaptations or variations of the embodiments of the invention. It is to be understood that the above description has been made in an illustrative fashion, and not a restrictive one.

Combination of the above embodiments, and other embodiments not specifically described herein will be apparent to those of skill in the art upon reviewing the above description. The scope of the various embodiments of the invention includes other applications in which the above structures and methods are used. Therefore, the scope of various embodiments of the invention should be determined with reference to the appended claims, along with the full range of equivalents to which such claims are entitled.

Accordingly, the scope of the invention should be determined not by the embodiments illustrated, but by appended claims and their legal equivalents.

What is claimed is:

1. A magnetic tunnel junction memory cell comprising:
   a non-linear element;
   a first electrically conductive line coupled to the non-linear element;
   a second electrically conductive line overlapping the first conductive line at a first intersection region;
   means for conducting magnetic flux wherein the means for conducting magnetic flux are positioned at the first intersection region in a vertical space between the first conductive line and the second conductive line;
   a magnetic tunnel junction memory element sandwiched by the means for conducting magnetic flux and electrically connected in series with the second conductive line, the means for conducting magnetic flux and the non-linear element;
   a third electrically conductive line parallel to the first conductive line; and
   a fourth electrically conductive line parallel to the second conductive line, overlapping the third conductive line at a second intersection region and defining a corner at the second intersection region, wherein the means for conducting magnetic flux are positioned in the corner at the second intersection region.

2. The magnetic tunnel junction memory cell of claim 1 wherein the means for conducting magnetic flux comprising at least a bottom magnetic portion and a top magnetic portion with the memory element being sandwiched between the top magnetic portion and the top magnetic portion.

3. The magnetic tunnel junction memory cell of claim 1, further including a first non-magnetic electrically conductive spacer and a second non-magnetic electrically conductive spacer, wherein the first non-magnetic spacer and the second non-magnetic spacer are positioned on either sides of the magnetic tunnel junction memory element to magnetically separate the magnetic tunnel junction memory element from the means for conducting magnetic flux.

4. The magnetic tunnel junction memory cell of claim 1 wherein the magnetic tunnel junction memory element comprising:
   a first magnetic layer comprising a perpendicular magnetization film;
   a second magnetic layer comprising a perpendicular magnetization film having a higher coercive force than that of the first magnetic layer, and
   a tunnel barrier layer sandwiched between the first magnetic layer and the second magnetic layer.

5. The magnetic tunnel junction memory cell of claim 4, further including a plurality of spin-polarizing layers positioned at least on one side of the tunnel barrier layer between the tunnel barrier layer and one of the magnetic layers.

6. A magnetic tunnel junction memory cell comprising:
   a non-linear element;
   a first electrically conductive read line coupled to the non-linear element;
   a second electrically conductive read line wherein the first read line and the second read line are preferably orthogonal and overlap each other at a read intersection region;
   a first electrically conductive write line being parallel to the first conductive read line;
   a second electrically conductive write line being parallel to the second conductive read line, wherein the first conductive write line and the second conductive write line overlap each other at a write intersection region and define a write corner;
   a magnetic flux guide comprising a first end and a second end, and being positioned at the read intersection region in the write corner; and
   a magnetic tunnel junction memory element positioned between the second end of the magnetic flux guide and the second read line, wherein the memory element is electrically connected in series with the second conductive read line, the magnetic flux guide and the non-linear element.

7. The magnetic tunnel junction memory cell of claim 6 wherein the second conductive read line has a multilayer structure comprising at least one conductive magnetic layer with the conductive magnetic layer being positioned adjacent the magnetic tunnel junction memory element.

8. The magnetic tunnel junction memory cell of claim 6 wherein the magnetic tunnel junction memory element comprises:
   a first magnetic layer having a perpendicular magnetization;
   a second magnetic layer having a perpendicular magnetization and a coercive force higher than that of the first magnetic layer; and
   a tunnel barrier layer sandwiched between the first magnetic layer and the second magnetic layer.

9. The magnetic tunnel junction memory cell of claim 8, further including a first electrically conductive non-magnetic spacer and a second electrically conductive non-magnetic spacer positioned on either side of the memory element to magnetically isolate the memory element from the magnetic flux guide and the second read line, wherein the first non-magnetic spacer is positioned at the first magnetic layer and at a second non-magnetic spacer is positioned at the second magnetic layer.

10. The MTJ memory cell of claim 9 wherein the second non-magnetic spacer having a direct contact with the second magnetic layer can be made of an antiferromagnetic material to stabilize a domain structure of the second magnetic layer.

11. A nonvolatile memory array comprising:
   a substrate;
   a first plurality of electrically conductive lines formed on the substrate;
   a second plurality of electrically conductive lines formed on the substrate and overlapping the first plurality of the lines at a plurality of first intersection regions;
   a plurality of memory cells formed on the substrate, each memory cell being positioned at a first intersection region between one of the first plurality of lines and one of the second plurality of lines, each memory cell comprising a non-linear element, a magnetic flux guide and a magnetic tunnel junction memory element electrically connected in series with one another and with one of the second plurality of conductive lines, wherein one of the first plurality of conductive lines is coupled to the non-linear element;
   a third plurality of electrically conductive lines formed on the substrate, being parallel to the first plurality of lines and being positioned in a vertical space between the first plurality of lines and the second plurality of lines; and
   a fourth plurality of electrically conductive lines formed on the substrate, being parallel to the second plurality of lines, being positioned in the vertical space between the first plurality of lines and the second plurality of lines, overlapping the third plurality of lines at a second plurality of intersection regions and defining a plurality of corners.

12. The nonvolatile memory array of claim 11, further including a first write circuitry coupled to the third plurality of lines and a second write circuitry coupled to the fourth plurality of lines, whereby during a write operation a current simultaneously passing through one of the third plurality of lines and one the fourth plurality of lines at one of the plurality of corners generates a magnetic filed acting on the magnetic tunnel junction memory element through the magnetic flux guide.

13. The nonvolatile memory array of claim 11, further including a first read circuitry coupled to the first plurality of lines and a second read circuitry coupled to the second plurality of lines for detecting a tunnel current through the magnetic tunnel junction memory element in a direction perpendicular to the substrate when a voltage across the non-linear element is greater than a threshold voltage of the non-linear element.

14. The nonvolatile memory array of claim 11 wherein the magnetic tunnel junction memory elements comprising:
   a tunnel barrier layer having a major plane;
   a first magnetic layer having a magnetization oriented perpendicular to the major plane of the tunnel barrier layer; and
   a second magnetic layer having a magnetization oriented perpendicular to the major plane of the tunnel barrier layer, wherein a coercive force of the second magnetic layer is higher than that of the first magnetic layer, and wherein the tunnel barrier layer is sandwiched between the first magnetic layer and the second magnetic layer.

15. The nonvolatile memory array of claim 11, further including a plurality of electrically conductive non-magnetic spacers, positioned on either side of the memory element to magnetically isolate the memory element from the magnetic flux guide.

16. The nonvolatile memory array of claim 11 wherein the magnetic flux guide comprises a magnetic pad, a magnetic stud and a magnetic cap.

17. The nonvolatile memory array of claim 16 wherein the magnetic cap and the magnetic pad overhang the magnetic stud and, one of the third plurality of lines and one of the fourth plurality of lines at one of the plurality of corners.

18. The nonvolatile memory array of claim 16 wherein the magnetic pads and the magnetic caps of the plurality of memory cells are magnetically isolated from one another by a plurality of non-magnetic gaps.

19. A method of operating a magnetic tunnel junction memory cell comprising:
   generating a magnetic write flux by passing a write current through an electrically conductive write line and an electrically conductive excitation line overlapping the write line and defining a corner;
   orienting a first magnetization orientation in a free magnetic layer of a magnetic tunnel junction memory element perpendicular to a major plane of a tunnel barrier layer using the magnetic write flux conducted through a magnetic flux guide, wherein the magnetic flux guide is positioned in the corner and comprises a first magnetic portion and a second magnetic portion, and the memory element is sandwiched between the first magnetic portion and the second magnetic portion of the magnetic flux guide; and
   sensing the first magnetization orientation in the free magnetic layer by passing a sense current through the memory element between an electrically conductive bit line and an electrically conductive word line in a direction generally perpendicular to the major plane of the tunnel barrier layer and by detecting a resistance of the memory element, wherein the memory element comprises the tunnel barrier layer, the free magnetic layer and a pinned magnetic layer with the tunnel barrier layer being sandwiched between the pinned magnetic layer and the free magnetic layer;
   whereby the resistance of the memory element is determined by the first magnetization orientation in the free magnetic layer relative to a second magnetization orientation in the pinned magnetic layer having a coercive force higher than that of the free magnetic layer, wherein the second magnetization orientation is perpendicular to the major plane of the tunnel barrier layer.

20. The method of operating the magnetic tunnel junction memory cell of claim 19, further including spin-polarizing the sense current with a first spin-polarizing layer and with a second spin-polarizing layer, wherein the first spin-polarizing layer is positioned between the pinned magnetic layer and the tunnel barrier layer and the second spin-polarizing layer is positioned between the free magnetic layer and the tunnel barrier layer.

21. The method of operating the magnetic tunnel junction memory cell of claim 19 further including stabilizing a domain structure of the pinned magnetic layer by an exchange coupling with an anti-ferromagnetic layer positioned between the pinned magnetic layer and the first portion of the magnetic flux guide.

22. A method of operating of a magnetic tunnel junction memory cell comprising:

generating a magnetic write flux by passing a write current through a first electrically conductive line and a second electrically conductive line, wherein the second conductive line overlaps the first conductive line and defines a corner;

orienting a first magnetization orientation in a pinned magnetic layer of a magnetic tunnel junction memory element perpendicular to a major plane of a tunnel barrier layer using the magnetic write flux conducted through a magnetic flux guide, wherein the magnetic flux guide is positioned in the corner and comprises a first magnetic portion and a second magnetic portion, and the memory element is positioned between the first portion and the second portion of the magnetic flux guide; and sensing the first magnetization orientation in the pinned magnetic layer by passing a sense current through the tunnel barrier layer in a direction generally perpendicular to the major plane of the tunnel barrier layer and by detecting a resistance of the memory element, wherein the magnetic tunnel junction element comprises the pinned magnetic layer and a free magnetic layer sandwiching the tunnel barrier layer;

whereby the resistance of the memory element is determined by the first magnetization orientation in the pinned magnetic layer relative to a second magnetization orientation in the free magnetic layer having a coercive force lower than that of the pinned magnetic layer when the sense current flows through the tunnel barrier layer; a magnetic state of the memory element is determined by the first magnetization orientation in the pinned magnetic layer.

23. The method of operating of the magnetic tunnel junction memory cell of claim 22 wherein sensing the first magnetization orientation in the pinned magnetic layer includes:

generating a magnetic excitation flux by passing an excitation current of a predetermined polarity and of a predetermined strength through a second electrically conductive line;

applying the magnetic excitation to the memory element through the magnetic flux guide to orient the second magnetization orientation in the free layer perpendicular to the major plane of the tunnel barrier layer in a predetermined direction; and sensing the magnetic state of the memory element by passing the sense current through the magnetic tunnel junction memory element between a third electrically conductive line and a fourth electrically conductive line, wherein the third conductive line is orthogonal to the fourth conductive line, overlaps the fourth conductive line at an intersection region, and the memory element is positioned in a vertical space between the third conductive line and the fourth conductive line at the intersection region.

* * * * *